(12) United States Patent
Kaneda (10) Patent No.: US 11,962,127 B2
(45) Date of Patent: Apr. 16, 2024

(54) EXTERNAL CAVITY SEMICONDUCTOR LASER

(71) Applicant: Arizona Board of Regents on Behalf of the University of Arizona, Tucson, AZ (US)

(72) Inventor: Yushi Kaneda, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 853 days.

(21) Appl. No.: 16/959,448

(22) PCT Filed: Dec. 19, 2018

(86) PCT No.: PCT/US2018/066432
§ 371 (c)(1),
(2) Date: Jul. 1, 2020

(87) PCT Pub. No.: WO2019/135915
PCT Pub. Date: Jul. 11, 2019

(65) Prior Publication Data
US 2020/0373738 A1 Nov. 26, 2020

Related U.S. Application Data

(60) Provisional application No. 62/614,174, filed on Jan. 5, 2018.

(51) Int. Cl.
*H01S 5/14* (2006.01)
*H01S 3/08* (2023.01)
(Continued)

(52) U.S. Cl.
CPC .......... *H01S 5/141* (2013.01); *H01S 3/08027* (2013.01); *H01S 3/08054* (2013.01);
(Continued)

(58) Field of Classification Search
CPC .. H01S 5/141; H01S 3/08027; H01S 3/08054; H01S 3/0816; H01S 5/18355; H01S 5/18361; H01S 5/041
See application file for complete search history.

(56) References Cited

U.S. PATENT DOCUMENTS 7,296,897 B2 11/2007 Mooradian et al.
7,397,829 B2 7/2008 Yoo et al.
(Continued)

OTHER PUBLICATIONS

International Search Report and Written Opinion, dated Mar. 7, 2019, for International Patent Application No. PCT/US2018/066432, filed Dec. 19, 2018 (11 pages).

*Primary Examiner* — Yuanda Zhang
(74) *Attorney, Agent, or Firm* — Perkins Coie LLP (57) ABSTRACT

External cavity laser systems are described that can operate with essentially no mode hopping. One example configuration of the laser system includes a semiconductor laser device, a folded cavity external to the semiconductor laser device, where at the semiconductor laser device is positioned at a fold in the folded cavity. In this configuration, at least one mirror is positioned in the folded cavity to enable sustained propagation of light within the folded cavity, and at least two polarization elements are positioned in the folded external cavity. The polarization elements cause a polarization state of the light that impinges in different directions on each semiconductor laser device that is positioned at a fold to be orthogonal to one another, thus eliminating or substantially reducing mode hopping in the laser output.

37 Claims, 11 Drawing Sheets

(51) Int. Cl.
*H01S 3/08022* (2023.01)
*H01S 3/081* (2006.01)
*H01S 5/183* (2006.01)
*H01S 5/04* (2006.01)

(52) U.S. Cl.
CPC ........ *H01S 3/0816* (2013.01); *H01S 5/18355* (2013.01); *H01S 5/18361* (2013.01); *H01S 5/041* (2013.01)

(56) References Cited

U.S. PATENT DOCUMENTS

| | | |
|---|---|---|
| 7,480,321 B2 | 1/2009 | Cho |
| 8,009,520 B2 | 8/2011 | Jau et al. |
| 9,231,373 B2 | 1/2016 | Fallahi et al. |
| 2010/0195675 A1* | 8/2010 | Moloney ................ H01S 3/108 372/4 |
| 2011/0182317 A1 | 7/2011 | Brick et al. |

* cited by examiner

EXTERNAL CAVITY SEMICONDUCTOR LASER

CROSS REFERENCE TO RELATED APPLICATIONS

This patent document is a 371 National Phase Application of International Patent Application No. PCT/US2018/066432, filed Dec. 19, 2018, which claims priority to the provisional application with Ser. No. 62/614,174, titled "Narrow-Linewidth External Cavity Semiconductor Laser," filed Jan. 5, 2018. The entire contents of the above noted applications are incorporated by reference as part of the disclosure of this document.

TECHNICAL FIELD

The technology in this patent document generally relates to laser systems, and more particularly to semiconductor laser systems having an external cavity.

BACKGROUND

This section is intended to provide a background or context to the disclosed embodiments. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

A vertical external-cavity Surface-emitting laser (VECSEL) is a semiconductor laser that includes one or more surface-emitting semiconductor gain chips and a laser resonator, as well as one or more external optical elements that complete the cavity. The semiconductor gain chip typically includes a Bragg mirror (e.g., a distributed Bragg reflector (DBR)) and an active gain region that includes several quantum wells (QWs). The semiconductor structure of a VECSEL is only a few microns thick, and is usually mounted on a heat sink for heat dissipation. The laser resonator is completed with an external mirror that is positioned anywhere in the range of a few millimeters to tens of centimeters from the semiconductor device.

VECSELs can generate high optical powers. For example, VECSEL outputs of greater than 20 W in a single frequency from a single device may be achieved. A major technical challenge in high-power VECSELs is thermal management. In particular, the heat dissipated in small volume/area of the semiconductor device must be removed with minimum temperature rise. As such, a proper thermal management strategy for the single-frequency, single-VECSEL configuration with 20 W output can require a complex, costly and bulky solution. One approach to manage the heat dissipation problem is to use multiple VECSEL devices in the laser resonator to achieve higher output powers, where the output power adds linearly with the number of devices. In such a configuration, heat dissipation is distributed among multiple devices. However, such multi-device VECSEL configurations do not operate in a single mode, suffer from longitudinal mode hopping and standing wave problems that are described later in this document. Moreover, such mode hopping issues are not exclusive to multi-device VECSEL configurations, but can also occur in a single-device VECSEL configuration, where the gain chip is placed at the cavity fold. The disclosed embodiments, among other benefits and advantages, address the above noted issues and describe external cavity laser configurations that eliminate or mitigate mode hopping issues.

DETAILED DESCRIPTION

In the following description, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

It should be noted that the terms VECSEL or VECSEL device are used in this patent document to refer to an active laser semiconductor device. It is, however, understood that the disclosed embodiments apply generally to semiconductor laser devices. For example, the disclosed embodiments apply to optical semiconductor lasers (OPSLs) and semiconductor disk laser (SDLs).

Figure 1:
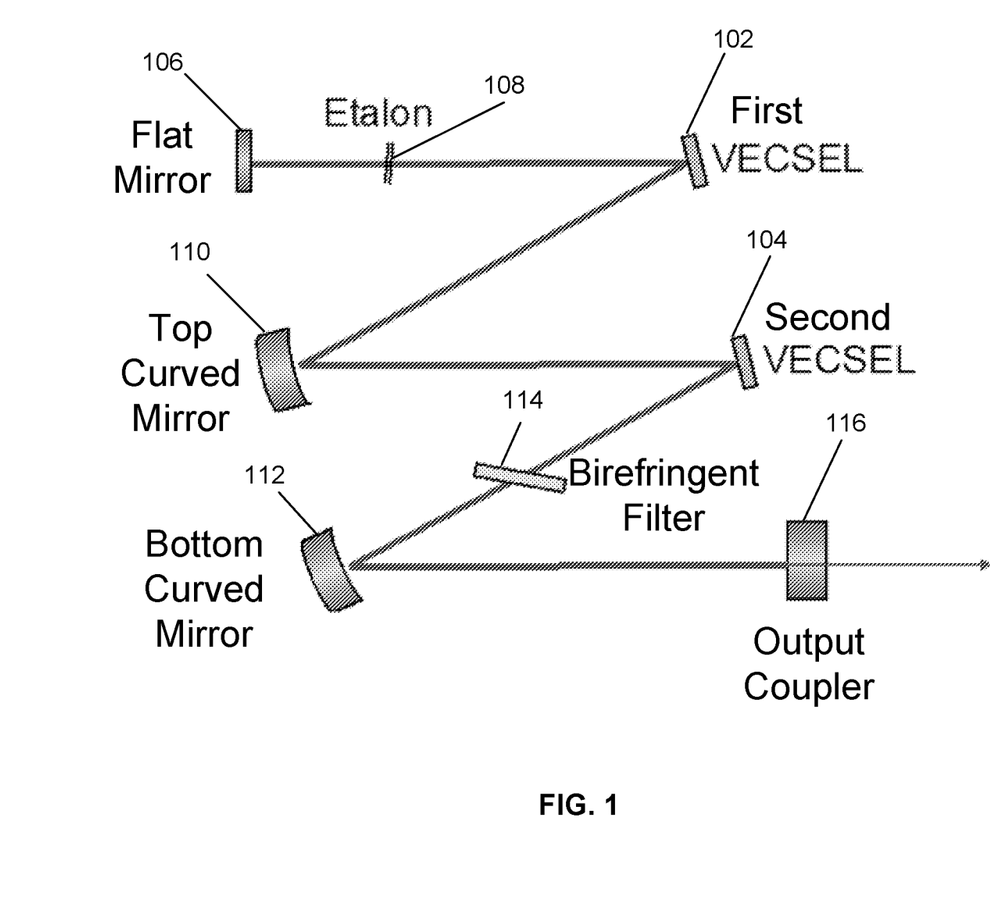
FIG. 1 illustrates an example multi-device VECSEL configuration.

FIG. 1 illustrates an example of a multi-device VECSEL configuration that can be used to facilitate the understanding of the disclosed technology. The configuration of FIG. 1 shows two VECSEL devices 102, 104 that are positioned at the folds of a standing wave cavity, including a flat end mirror 106, an etalon 108, a top curved mirror 110, a bottom curved mirror 112, a birefringent filter 114, and an output coupler 116. The etalon 108 can be a glass parallel plate (e.g., uncoated) that is used for fine wavelength tuning, and the birefringent filter 114 can be used for coarse wavelength tuning. The latter can, for example, comprise a crystalline quartz plate that is inserted at an angle near the Brewster's angle. The birefringence leads to wavelength-dependent transmission losses that allow the selection of a desired range of wavelengths. The top 110 and bottom 112 curved mirrors, as well as the flat end mirror 106, can each be, for example, a highly reflective dielectric mirror. The output coupler 116, which can have a transmittance of a few percent, allows the extraction of a portion of the light from the laser's intracavity beam; the transmitted light is the usable output of the laser configuration. The configuration in FIG. 1 can be optically pumped, and tuned to provide an output optical beam with a desired power and range of wavelengths. It should be noted that while FIG. 1 shows one flat mirror 106 and two curved mirrors 110, 112, in some configurations, the flat mirror 106 may be replaced with a curved mirror, and in some configurations, only one curved mirror may be used.

Figure 2:
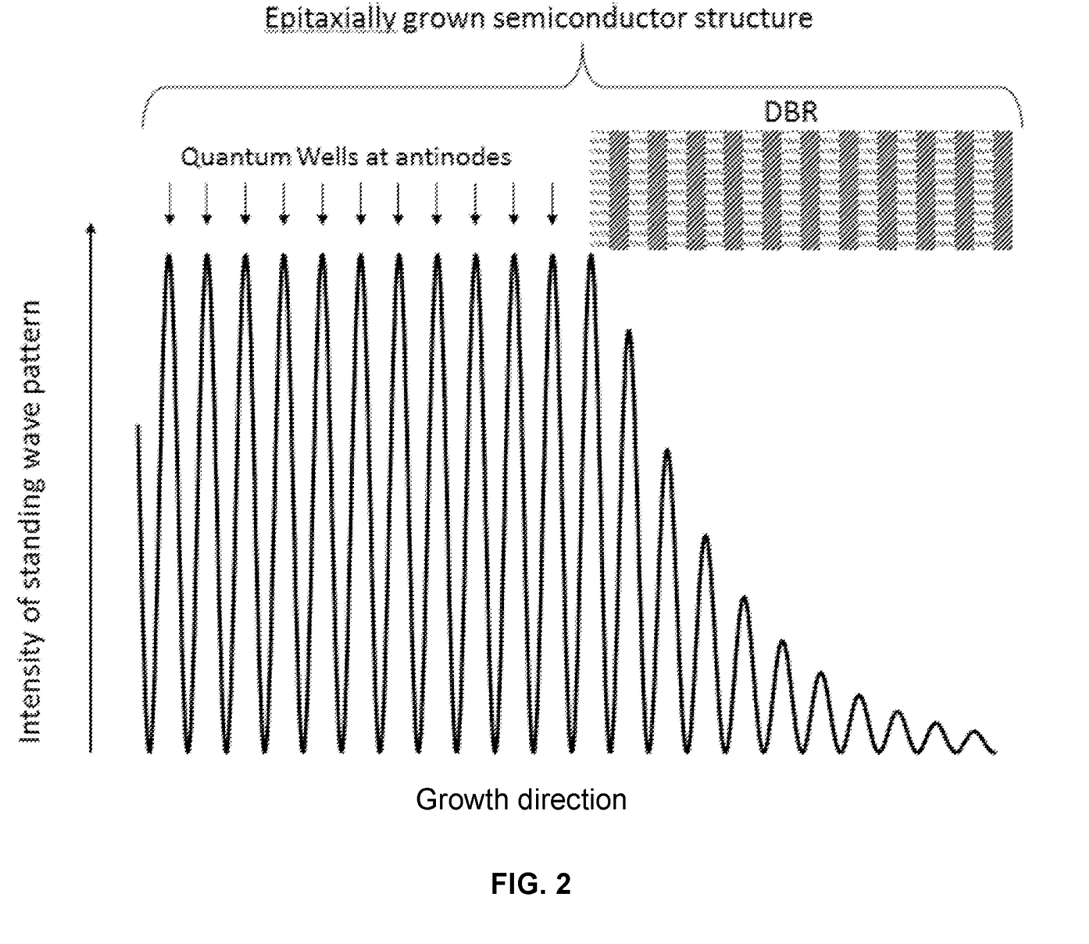
FIG. 2 illustrates an example standing wave pattern in semiconductor device that includes a distributed Bragg reflector (DBR) and several quantum wells (QWs).

To illustrate mode hopping problems associated with the configuration of FIG. 1, it is instructive to quickly review some basic features of a VECSEL device. A typical VECSEL uses a resonant periodic gain structure (RPG); the quantum wells that provide the optical gain are at the antinode of the standing wave pattern of the resonator. The conceptual schematic is shown in FIG. 2, which illustrates the distributed Bragg reflector (DBR) and an active gain region that includes several quantum wells. Matching of the quantum well position in the RPG and the standing wave pattern is often assured by monolithic construction of the VECSEL device. As the rear reflector, the DBR is monolithically integrated within the device, and the standing wave pattern is "fixed" to the DBR, thus the relative position of the DBR to the quantum well is determined at the time of epitaxial growth. This relationship is maintained only when the VECSEL device is located at the end of the standing-wave cavity. When the VECSEL device is placed at the fold in the standing-wave laser resonator (such as in the configuration of FIG. 1), the standing wave pattern at the quantum wells becomes unstable and the output becomes noisy.

Figure 3:
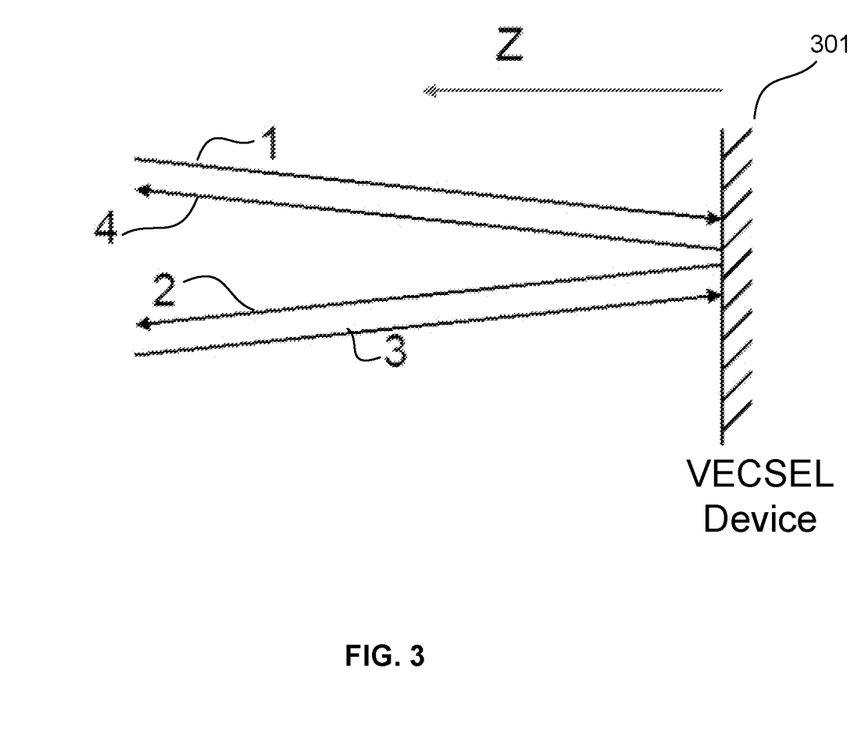
FIG. 3 illustrates an example of incident and reflected waves in a VECSEL device that is positioned at a cavity fold.

To further illustrate some of the issues associated with the standing wave pattern, consider the schematic diagram of FIG. 3, which illustrates a VECSEL device 301 at the fold of a cavity, and a wave incident on the VECSEL device 301 a at a small angle (wave 1), a reflected wave (wave 2), the counter-propagating wave (wave 3) that is incident on the VECSEL device 301 in a reverse path relative to wave 2 and an associated reflected wave (wave 4), all of which overlap within the VECSEL device 310. All of the four waves are at the same frequency, so they have the same magnitude of the wave vector. By considering the phase difference, $\varphi$, between waves 2 and 3, which depends on the optical path length between the VECSEL device 301 and the end of the resonator (not shown), one can find that the standing wave pattern formed at the VECSEL device depends on the phase different, $\varphi$, as shown in the exemplary intensity pattern of FIG. 4.

Figure 4:
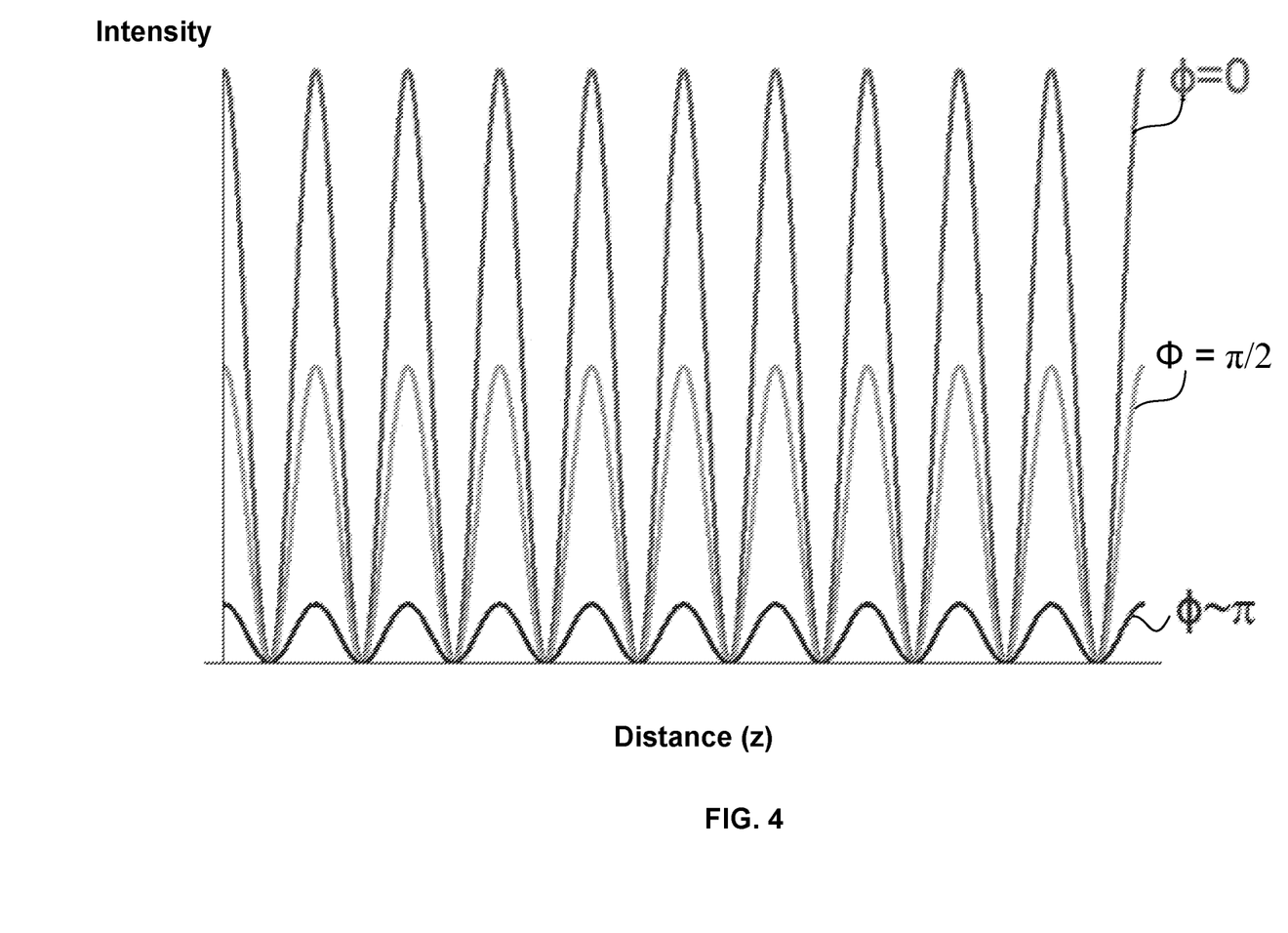
FIG. 4 illustrates a standing wave pattern as function of phase difference for example waves of FIG. 3.

As is evident from FIG. 4, the intensity approaches zero when $\varphi$ approaches $\pi$, thus providing no optical gain as the quantum wells cannot interact with the optical field. This means, in practice, that the laser hops to a different longitudinal mode, i.e., to a mode that has the intensity peak at the quantum well so that the stored power can be extracted. In some applications, this mode hop may be acceptable, especially if the hop is fairly small (e.g., less than 1 GHz in some applications). However, in other applications such hops can be undesirable. For example, in configurations where the laser cavity is 15-50 cm, the longitudinal mode spacing is 300 MHz to 1 GHz, making such mode hops undesirable. One example application that benefits from the suppression of mode hopping relates to systems for construction of a laser guided star (LGS), which will be described in more detail in a later section of this patent document.

In some embodiments, the problem of mode hopping is alleviated by an entirely passive approach that causes the eigenpolarization of the laser cavity at the VECSEL devices to be the counter-rotating circular polarizations for the two counter-traveling waves. In one exemplary configuration, this is realized by inserting a pair of quarter-wave plates (QWPs) such that all VECSEL devices are positioned at the folds between the QWPs. This configuration can also include polarization elements, such as Brewster's window or a birefringent filter, positioned to impart a specific polarization state onto the propagating beam, depending on the beam direction.

Figure 5:
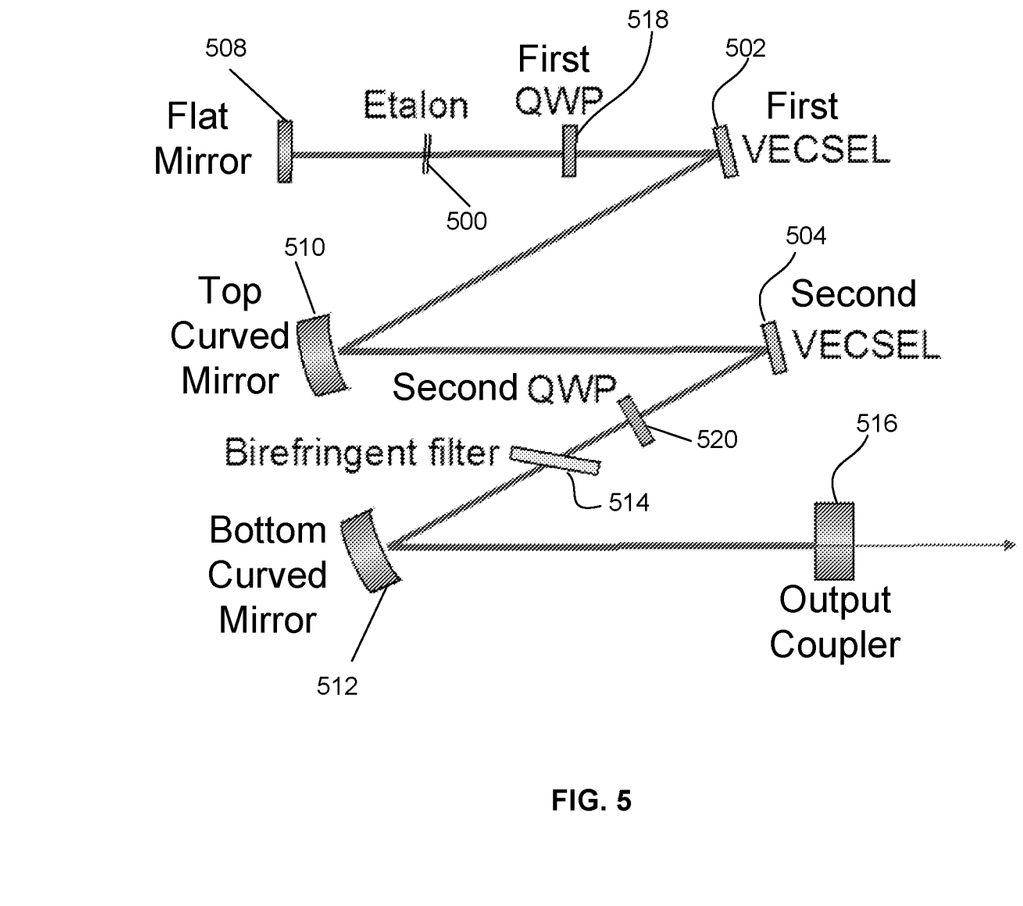
FIG. 5 illustrates a laser configuration including VECSEL devices and quarter-wave plates (QWPs) in accordance with an exemplary embodiment.

FIG. 5 illustrates a laser configuration including two VECSEL devices and two QWPs in accordance with an exemplary embodiment. The depicted configuration includes a first VECSEL device 502, a second VECSEL device 504, an etalon 506, a flat mirror 508, a top curved mirror 510, a bottom curved mirror 512, a Birefringent filter 514 and an output coupler 516, which can be similar to those described in connection with FIG. 1. The configuration of FIG. 5 further includes a first QWP 518 and a second QWP 520. The second QWP 520 near the polarization element (birefringent filter 514 in FIG. 5) is oriented at 45 degrees from the angle of polarization. Starting from the bottom and moving to the top in FIG. 5, the light travels from the bottom curved mirror 512 to the birefringent filter (BF) 514 and exits the BF 514 as linearly polarized (e.g., in the plane of the drawing). Such light, after propagating through the second QWP 520 becomes circularly polarized (e.g., clockwise circularly polarized). The circularly polarized light travels through the zigzag path, which includes the second VECSEL device 504, the top curved mirror 510 and the first VECSEL device 502, before propagating through the first QWP 518. The light that exits the first QWP 518 toward the flat mirror 508 is linearly polarized, and upon reflection from the flat mirror 508 and propagation back through the first QWP 518, becomes circularly polarized in an opposite direction (e.g., counterclockwise circularly polarized). In general, each of the QWPs 518, 520 can be a polarization element that converts the circularly polarized light to linearly polarized light (and vice versa).

Figure 6:
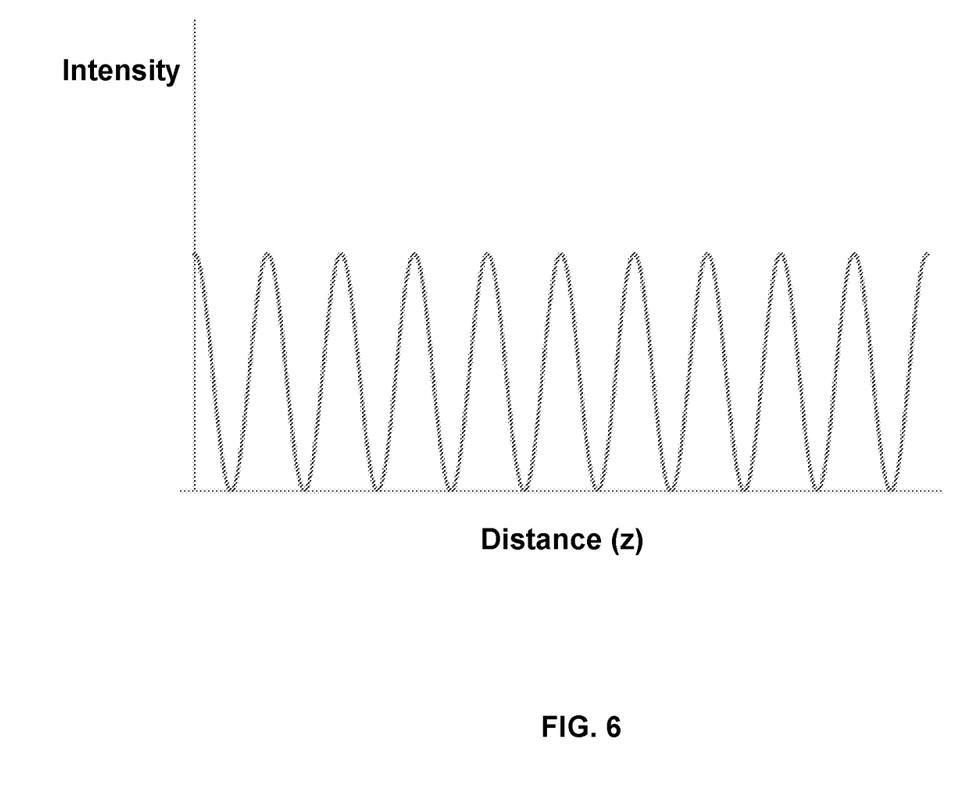
FIG. 6 illustrates a standing wave at the fold of the cavity for all phase difference values in accordance with an exemplary embodiment.

In the exemplary configuration of FIG. 5, for each VECSEL device, the standing wave pattern created by wave 1 and wave 2 (using the convention of FIG. 3) are orthogonal to that created by wave 3 and wave 4, and thus do not interfere with each other. As a result, the intensity of the standing wave pattern at the VECSEL devices 502, 504 is stationary regardless of the phase difference, $\varphi$. FIG. 6 illustrates one such exemplary standing wave at the fold of the cavity for all $\varphi$. Therefore, in this configuration the overlap of the optical field and the quantum well does not change for any longitudinal mode; as a result, the effective gain of the laser remains constant regardless of $\varphi$. Accordingly, disturbances to the cavity do not diminish the gain to any particular longitudinal mode, and mode-hop free operation of the laser device can be achieved.

Figure 7:
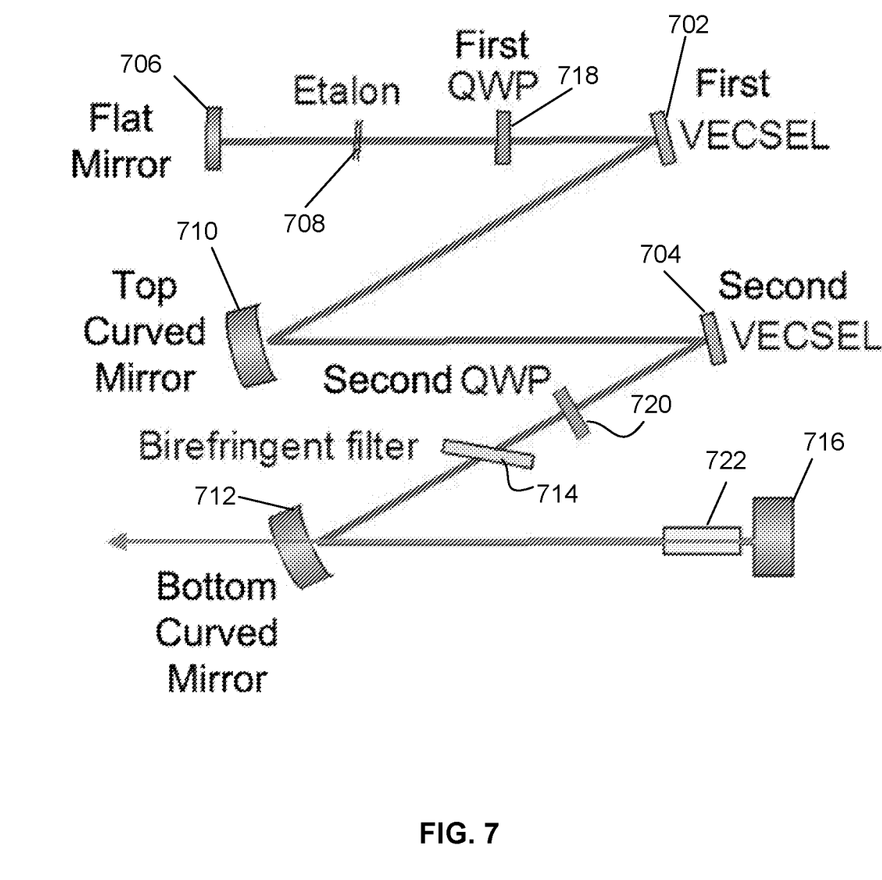
FIG. 7 illustrates a laser configuration including VECSEL devices, QWPs and a non-linear crystal in accordance with an exemplary embodiment.

FIG. 7 illustrates an exemplary embodiment in which the configuration of FIG. 5 is augmented with a non-linear crystal to effectuate frequency doubling via intracavity second harmonic generation (SHG). In particular, the configuration of FIG. 7 includes a first VECSEL device 702, a second VECSEL device 704, an etalon 706, a flat mirror 708, a top curved mirror 710, a bottom curved mirror 712, a Birefringent filter 714, a first QWP 718 and a second QWP 720, which can be similar to those described in connection with FIGS. 1 and 5. The configuration of FIG. 7 further includes a non-linear crystal 722 (e.g., a second harmonic generation (SHG) crystal) and a second flat mirror 716 (as opposed to the output couplers 116 and 516 in FIGS. 1 and 5). By having the VECSEL device(s) 702, 704 at the folds, and having multiple devices in the cavity, the round-trip gain inside the cavity can be increased, allowing the use of larger nonlinear coupling (e.g., through a tighter focus into the SHG crystal, or longer SHG crystal), thus allowing efficient second harmonic generation. One example a SHG crystal is a lithium triborate (LBO) crystal, which has a high damage threshold and low optical loss that are both suited for VECSEL devices having relatively low small signal gain, as well as high saturation intensity.

Figure 8:
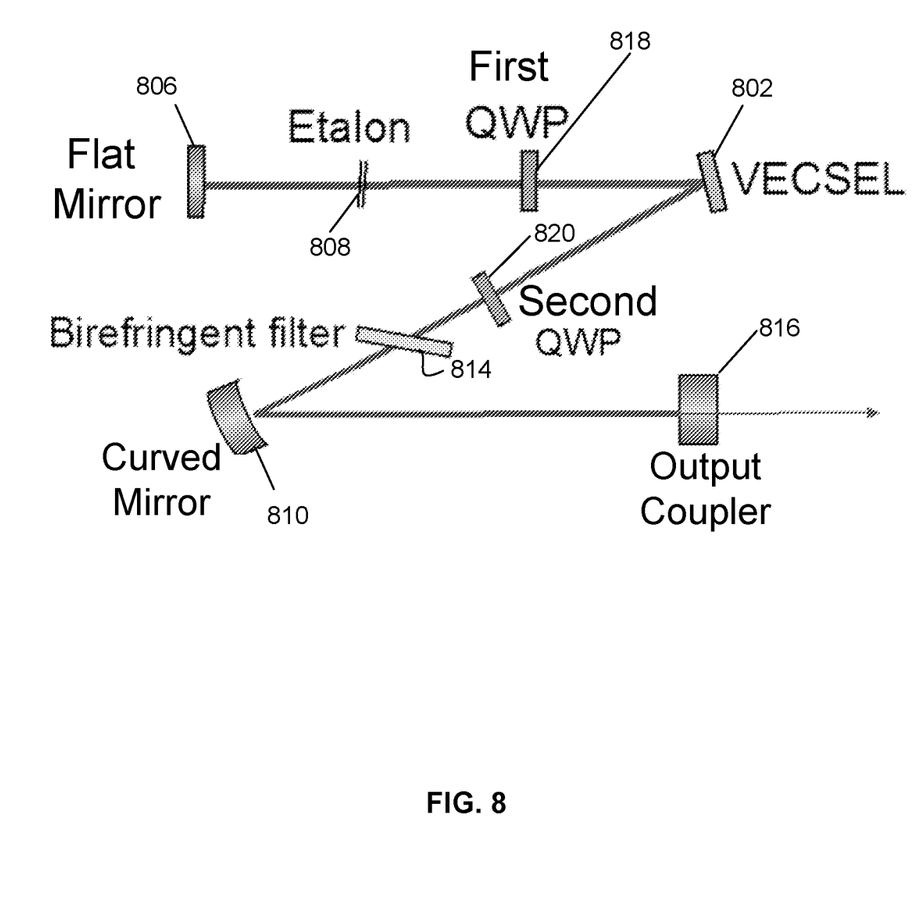
FIG. 8 illustrates a laser configuration including a single VECSEL device and two QWPs in accordance with an exemplary embodiment.

FIG. 8 illustrates another exemplary embodiment in which mode-hop free operation is effectuated in a configuration with a single VECSEL device. The configuration of FIG. 8 includes a VECSEL device 702, an etalon 806, a flat mirror 808, a curved mirror 810, a Birefringent filter 814, an output coupler 816, a first QWP 818 and a second QWP 820, which can be similar to those described in connection with FIGS. 1, 5 and 7. In operation, the polarization state of the light that impinges on the VECSEL device can be similar to that described in connection with FIG. 5. Notably, the light that propagates from the second QWP 820 to the VECSEL device 802 is circularly polarized in a first orientation (e.g., clockwise circularly polarized), whereas the light that reflects from the flat mirror 806, after propagation through the first QWP 818, becomes circularly polarized in an opposite orientation (e.g., counterclockwise circularly polarized). The configuration of FIG. 8 can be further adapted (e.g., similar to that in FIG. 7) to produce frequency-doubled laser output. In some embodiments, the curved mirror 810 may also operate as the output coupler, eliminating the output coupler 816 that is depicted in FIG. 8.

Figure 9:
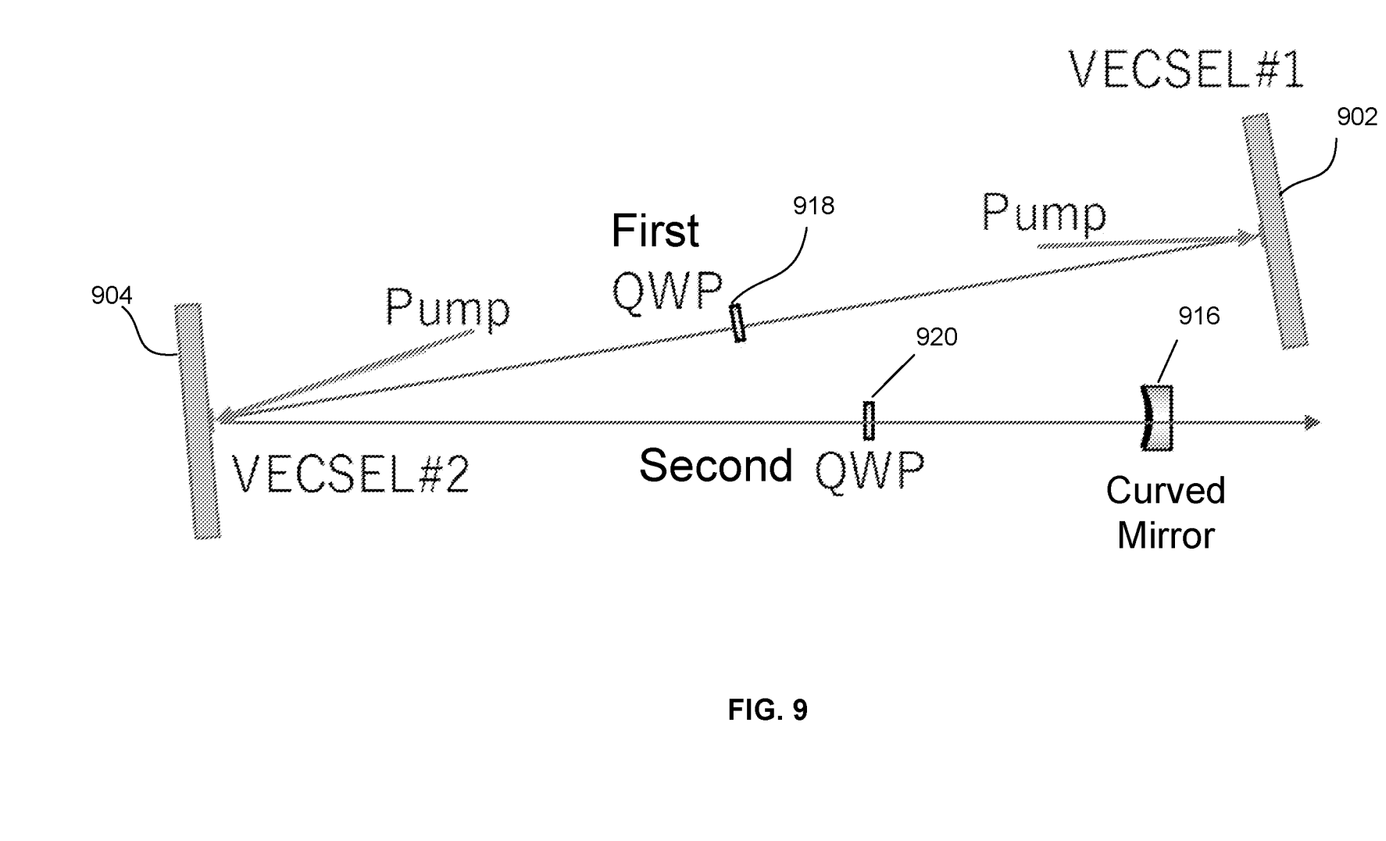
FIG. 9 illustrates a pumped laser configuration including two VECSEL device, two QWPs and a single mirror in accordance with an exemplary embodiment.

FIG. 9 illustrates another exemplary embodiment in which mode-hop free operation is effectuated in a configuration with two VECSEL devices and a curved mirror. The configuration of FIG. 9 includes a first VECSEL device 902, a second VECSEL device 904, a first QWP 918 and a second QWP 920, which can be similar to those described in connection with prior configurations. The first and second VECSEL devices 902, 904 also operate as mirrors in the cavity, and the curved mirror 916 also operates as the output coupler, similar to the bottom curved mirror 712 of FIG. 7. The configuration of FIG. 9 further illustrates that the VECSEL devices 902, 904 are optically pumped. The principles of operation are similar to those described in connection with prior configurations. The propagating beam travels back and forth in the cavity formed by the two VECSEL devices 902, 904 and the curved mirror 916. VECSEL #1 902 further operates as an end mirror (note that, unlike VECSEL #2 904, only two waves interfere at VECSEL #1 902). The birefringent filter (not shown) can be placed, for example, between the second QWP 920 and the curved mirror 916.

Figure 10:
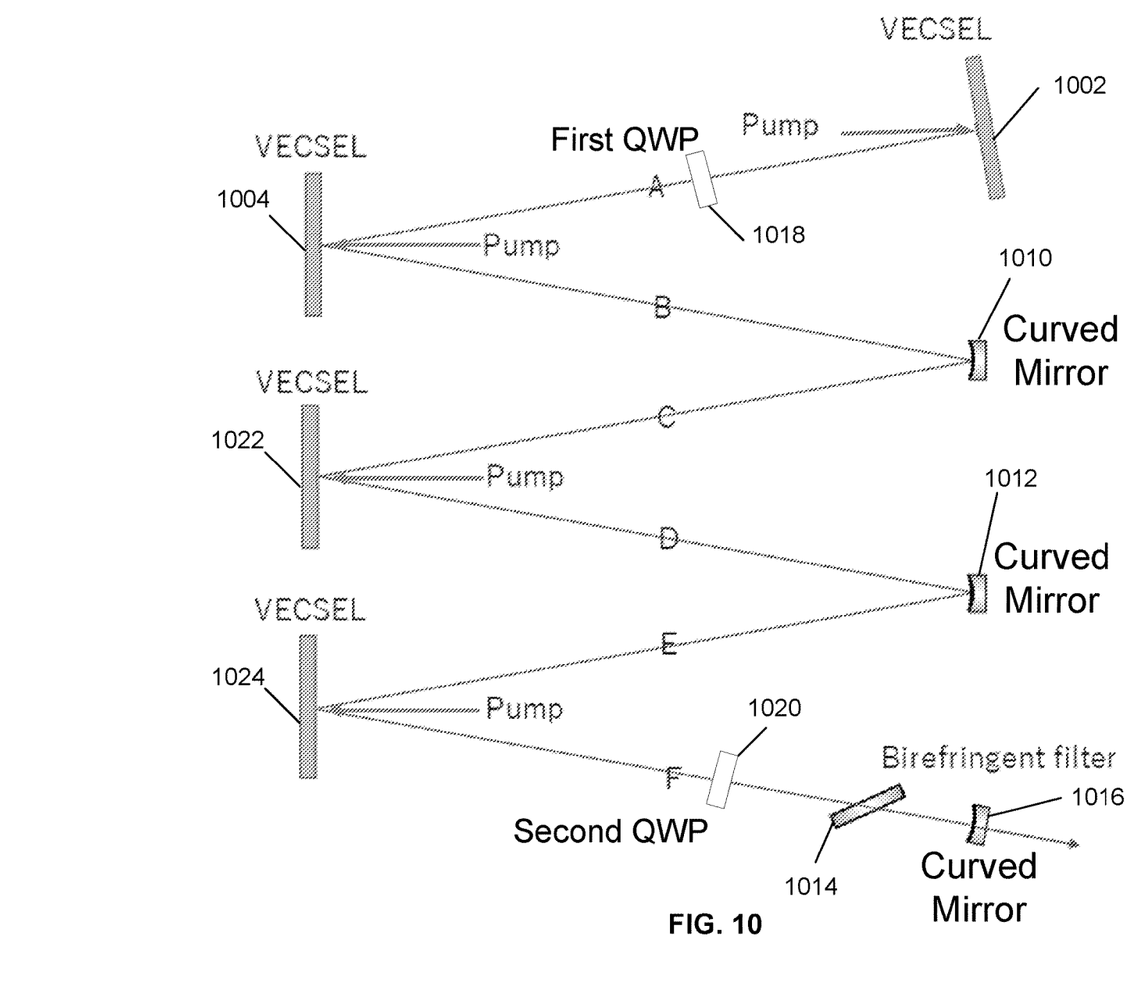
FIG. 10 illustrates a pumped laser configuration including four VECSEL device, and three mirrors in accordance with an exemplary embodiment.

FIG. 10 illustrates yet another exemplary embodiment in which a mode-hop free operation is effectuated in a configuration with four VECSEL devices and three mirrors. The configuration of FIG. 10 includes a first VECSEL device 1002, a second VECSEL device 1004, a third VECSEL device 1022, a fourth VECSEL device 1024, a first curved mirror 1010, a second curved mirror 1012, a Birefringent filter 1014, a first QWP 101, a second QWP 1020, and a third curved mirror 106, which also operates as the output coupler. The VECSEL devices are shown as being optically pumped. The principles of operation are similar to those described in connection with prior configurations. The configuration of FIG. 10 enables the generation of a higher output power.

One common feature among the disclosed example configurations is that a pair of QWPs sandwiches all VECSEL devices that are positioned at the cavity folds. Moreover, the birefringent filter or any polarizing element, such as a Brewster's window, is not positioned between the QWPs. In this way, all VECSEL devices at the folds receive forward and backward propagating beams in circular polarizations of opposite direction, so that the magnitude of the standing wave pattern does not depend on their relative phases. It should be further noted that in the above example configurations, a QWP changes the linearly polarized light into circularly polarized light only when its axis is 45 degrees from the incident polarized light. Additionally, while the disclosed semiconductor laser devices in some embodiments have been illustrated to be optically pumped (see, e.g., FIGS. 9 and 10), it is understood that in some embodiments such devices can be electrically pumped (e.g., via electrical current injection) wherein the semiconductor device is configured in an RPG.

It should be further noted that the disclosed embodiments can be further extended to include laser systems that utilize additional VECSEL devices. As noted earlier, the inclusion of additional devices allows the implementation of higher output power laser systems (e.g., a scalable system) while keeping the thermal management issues in check. Moreover, an added benefit of a multi-device configuration is that the entire system can operate on "soft-failure mode", which allows uninterrupted operation by increasing the output of some of the pump diodes when one of the devices fails.

Example performance characteristics of the disclosed embodiments include narrow-linewidth (e.g., less than 1 GHz), more than 10 W from a single device with a high power (e.g., greater than 30 W) pump diode, and more than 3 W from a single device laser with lower pump powers. Moreover, multiple devices (e.g., two or three devices) can be placed in the cavity to provide increased power output. By way of example and not limitation, more than 10 W output power can be achieved at 1141 nm or 1178 nm output wavelengths. Operations at other wavelengths (e.g., 1064 nm, 970 nm and 915 nm) can be readily accomplished.

Example cavity lengths include 20 to 30 cm long cavities that accommodate a two-device configuration. In such configurations, the free spectral range (FSR) of the cavity is about 500-750 MHz. In the case of a single VECSEL device, the cavity is shorter, hence the FSR is even larger. This causes the output spectrum to be single frequency. In numerous experiments, the disclosed VECSELs operated in a single frequency with or without an intracavity etalon. Example thickness values for the VECSEL devices are in the range 4 to 8 µm.

Figure 11:
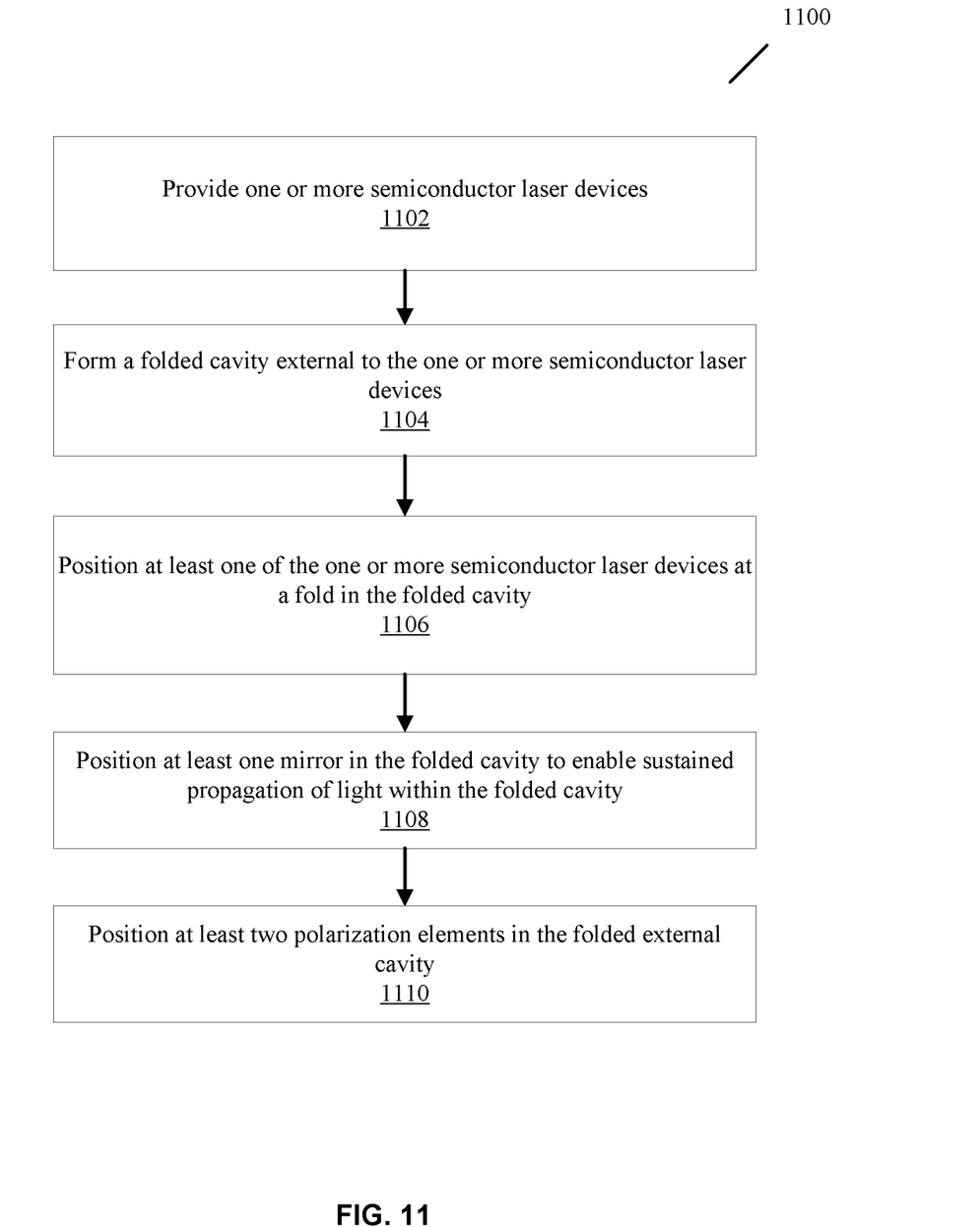
FIG. 11 illustrates a set of operations that can be carried out to produce a substantially mode-hop-free laser system in accordance with an exemplary embodiment.

FIG. 11 illustrates a set of operations 1100 that can be carried out to produce a substantially mode-hop-free laser system in accordance with an exemplary embodiment. At 1102, one or more semiconductor laser devices re provided. At 1104, a folded cavity external to the one or more semiconductor laser devices is formed. The formation of the folded external cavity includes: at 1106, positioning at least one of the one or more semiconductor laser devices at a fold in the folded cavity; at 1108, positioning at least one mirror in the folded cavity to enable sustained propagation of light within the folded cavity; and at 1110, positioning at least two polarization elements in the folded external cavity. The at least two polarization elements are configured to cause a polarization state of light that impinges in a first direction on each semiconductor laser device that is positioned at a corresponding fold to be orthogonal to a polarization state of light that impinges in a second direction on each semiconductor laser device that is positioned at the corresponding fold.

In one exemplary embodiment, the above noted operations further includes positioning a third polarization element positioned between the second mirror and the second polarization element. In an exemplary embodiment, the third polarization element is a birefringent filter. In some exemplary embodiment, the third polarization element is configured to (a) cause the light that propagates from the third polarization element towards the second polarization element to be linearly polarized, or (b) enable wavelength tuning of laser light that is output from the laser system.

In another exemplary embodiment, the above noted method additionally includes positioning a non-linear crystal within the external folded cavity configured to modify a frequency of output laser light by second harmonic generation. In some embodiments, the method further includes placing an output coupler at one end of the folded external cavity to allow laser light to be transmitted through the output coupler and to provide laser light that is output from the laser system.

Example Application of the Laser System:

One particular application for the disclosed embodiments relates to the construction of a laser guide star (LGS) or a polychromatic laser guide star (PLGS) that can be used for improving the operations of adaptive optics (AO) in telescopes in order to correct atmospheric distortion. In sodium beacon LGS systems, sodium beacons are created by a 589 nm laser light that is used to energize atoms in the sodium layer of the mesosphere at an altitude of around 90 km. The sodium atoms then re-emit the laser light, producing a glowing artificial star. In PLGS systems, which allows the tip-tilt to be directly measured, two transitions of the sodium atom, the usual 589.0 nm D2 line and a near-IR line at 1141 nm, are used.

The disclosed embodiments provide a solution for constructing a PLGS that uses two laser systems (e.g., based on the configuration of FIG. 5 or of FIG. 8) that operate at wavelengths 1178 nm and 1141 nm. The former, after frequency doubling (e.g., based on the configuration in FIG. 7), delivers a high power at 589.0 nm. Based on the disclosed technology, the lasers can be stabilized to provide mode-hop free operation with a narrow linewidth of 10 MHz, thus improving the overall efficiency of such systems.

It is thus evident that the disclosed embodiments enable substantially mode-hop-free operation laser systems that include a folded external cavity. One aspect of the disclosed technology relates to a laser system that includes a semiconductor laser device and an external folded cavity. The external folded cavity includes a reflective surface positioned at one end of the external folded cavity, a mirror positioned in the external folded cavity to allow sustained propagation of light in the external folded cavity, and a first polarization element and a second polarization element. In the laser system, the semiconductor laser device is positioned at a cavity fold between the reflective surface and the mirror, the first polarization element is positioned between the reflective surface and the semiconductor laser device, the second polarization element is positioned between the mirror and the semiconductor laser device, and the first and the second polarization elements are configured to cause light that propagates from the first polarization element towards the semiconductor laser device to have an orthogonal polarization state compared to light that propagates from the second polarization element towards the semiconductor laser device.

Another aspect of the disclosed embodiments relates a laser system that includes a semiconductor laser device, and an external folded cavity. The external cavity includes a reflective surface positioned at one end of the external folded cavity, a mirror positioned in the external folded cavity to allow sustained propagation of light in the external folded cavity, and a first polarization element and a second polarization element. In this laser system, the semiconductor laser device is positioned at a cavity fold between the reflective surface and the mirror, the first polarization element is positioned between the reflective surface and the semiconductor laser device, the second polarization element is positioned between the mirror and the semiconductor laser device, and the first and the second polarization elements are configured to cause light that propagates from the first polarization element towards the semiconductor laser device to have an orthogonal polarization state compared to light that propagates from the second polarization element towards the semiconductor laser device.

In one exemplary embodiment, each of the first and the second polarization elements is a quarter wave plate that converts a linearly polarized light into a circularly polarized light and vice versa. In another exemplary embodiment, the first polarization element is configured to produce one of either a clockwise or a counterclockwise circularly polarized light that propagates from the first polarization element towards the semiconductor laser device, and the second polarization element is configured to produce another of the clockwise or the counterclockwise circularly polarized light that propagates from the second polarization element towards the first semiconductor laser device. In some embodiments, the reflective surface is a flat mirror or a surface of a vertical external cavity surface emitting laser (VECSEL) device, and the mirror is a curved mirror.

According to an exemplary embodiment, the laser system includes a third polarization element positioned between the second mirror and the second polarization element. For example, the third polarization element is a birefringent filter. In some embodiments, the third polarization element is configured to cause light that propagates from the third polarization element towards the second polarization element to be linearly polarized, or to enable wavelength tuning of laser light that is output from the laser system. In another exemplary embodiment, the laser system also includes a non-linear crystal positioned within the external folded cavity to cause doubling of output laser light frequency by second harmonic generation. In still other embodiment, the semiconductor laser device includes a vertical external cavity surface emitting laser (VECSEL), an optical semiconductor laser (OPSL), or a semiconductor disk laser (SDL).

In another exemplary embodiment, the laser system includes an output coupler configured to allow laser light to be transmitted through the output coupler and to provide laser light that is output from the laser system. In some embodiments, the laser system is configured to produce an output laser light having power that is greater than 10 Watts. The laser system can be configured to produce a single mode output laser light that substantially excludes mode hops. In an exemplary embodiment, at least one semiconductor laser device is also configured to operate as an output coupler to allow laser light to be output from the laser system. Moreover, in some embodiments, at least one semiconductor laser device is an optically pumped semiconductor laser device, while in other embodiments, at least one semiconductor laser device is an electrically pumped semiconductor laser device.

Another aspect of the disclosed embodiments relates a laser system that includes a first semiconductor laser gain device, a second semiconductor laser gain device, and an external folded cavity. The external folded cavity includes a first mirror positioned at one end of the external folded cavity, an output coupler positioned at another end of the external folded cavity, a second mirror positioned between the first semiconductor laser gain device and the second laser gain device, a third mirror positioned between the second semiconductor laser gain device and output coupler, and a first polarization element and a second polarization element. In such a laser system, the first semiconductor laser gain device is positioned at a first cavity fold between the first mirror and the second mirror, the second semiconductor laser gain device is positioned at a second cavity fold between the second mirror and the third mirror, the first polarization element is positioned between the first mirror and the first semiconductor laser gain device, the second polarization element is positioned between the third mirror and the second semiconductor laser gain device, and the first and the second polarization elements are configured to cause light that propagates from the first polarization element towards each of the first and the second semiconductor laser gain devices to have an orthogonal polarization state compared to light that propagates from the second polarization element towards each of the first and the second semiconductor laser gain devices.

In the above noted laser system, each of the first and the second polarization elements can be a quarter wave plate that converts a linearly polarized light into a circularly polarized light and vice versa. In some embodiments, the first polarization element is configured to produce one of either a clockwise or a counterclockwise circularly polarized light that propagates from the first polarization element towards each of the first and the second semiconductor laser gain devices, and the second polarization element is configured to produce another of the clockwise or the counterclockwise circularly polarized light that propagates from the second polarization element towards each of the first and the second semiconductor laser gain devices. In an exemplary embodiment, the first mirror is a flat mirror and at least one of the second or third mirrors is a curved mirror. In one exemplary embodiment, the laser system is configured to produce an output power of greater than 20 Watts. In another exemplary embodiment, the laser system is configured to produce an output power that is a summation of an output power producible by the first semiconductor laser gain device and an output power producible by the second semiconductor laser gain device. In still another exemplary embodiment, the laser system is configured to produce a single frequency output light with a spectral linewidth that is less than 1 GHz. For example, the spectral linewidth is about 10 MHz.

While the above description has been described using different examples to illustrate the underlying technological features, it is understood that various elements from different embodiments of the laser systems and associated methods can be combined. As such, the foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, and systems.

What is claimed is:

1. A laser system, comprising:
   one or more semiconductor laser devices;
   a folded cavity external to the one or more semiconductor laser devices, wherein at least one of the one or more semiconductor laser devices is positioned at a fold in the folded cavity;
   at least one mirror positioned in the folded cavity to enable sustained propagation of light within the folded cavity; and
   at least two polarization elements positioned in the folded cavity to cause a polarization state of light that impinges in a first direction on each semiconductor laser device that is positioned at a corresponding fold to be orthogonal to a polarization state of light that impinges in a second direction on each semiconductor laser device that is positioned at the corresponding fold.

2. A laser system, comprising:
   a semiconductor laser device; and
   an external folded cavity including:
      a reflective surface positioned at one end of the external folded cavity,
      a mirror positioned in the external folded cavity to allow sustained propagation of light in the external folded cavity, and
      a first polarization element and a second polarization element, wherein:
         the semiconductor laser device is positioned at a cavity fold between the reflective surface and the mirror,
         the first polarization element is positioned between the reflective surface and the semiconductor laser device,
         the second polarization element is positioned between the mirror and the semiconductor laser device, and
         the first and the second polarization elements are configured to cause light that propagates from the first polarization element towards the semiconductor laser device to have an orthogonal polarization state compared to light that propagates from the second polarization element towards the semiconductor laser device.

3. The laser system of claim 2, wherein each of the first and the second polarization elements is a quarter wave plate that converts a linearly polarized light into a circularly polarized light and vice versa.

4. The laser system of claim 2, wherein the first polarization element is configured to produce one of either a clockwise or a counterclockwise circularly polarized light that propagates from the first polarization element towards the semiconductor laser device, and the second polarization element is configured to produce another of the clockwise or the counterclockwise circularly polarized light that propagates from the second polarization element towards the first semiconductor laser device.

5. The laser system of claim 2, wherein:
the reflective surface is one of a flat mirror or a surface of a vertical external cavity surface emitting laser (VECSEL) device, and
the mirror is a curved mirror.

6. The laser system of claim 2, further comprising a third polarization element positioned between the second mirror and the second polarization element.

7. The laser system of claim 6, wherein the third polarization element is a birefringent filter.

8. The laser system of claim 6, wherein the third polarization element is configured to:
cause light that propagates from the third polarization element towards the second polarization element to be linearly polarized, or
enable wavelength tuning of laser light that is output from the laser system.

9. The laser system of claim 2, further including a non-linear crystal positioned within the external folded cavity to cause doubling of output laser light frequency by second harmonic generation.

10. The laser system of claim 2, wherein the semiconductor laser device includes a vertical external cavity surface emitting laser (VECSEL), an optical semiconductor laser (OPSL), or a semiconductor disk laser (SDL).

11. The laser system of claim 2, further including an output coupler configured to allow laser light to be transmitted through the output coupler and to provide laser light that is output from the laser system.

12. The laser system of claim 2, configured to produce an output laser light having power that is greater than 10 Watts.

13. The laser system of claim 2, configured to produce a single mode output laser light that substantially excludes mode hops.

14. The laser system of claim 1, wherein at least one semiconductor laser device is also configured to operate as an output coupler to allow laser light to be output from the laser system.

15. The laser system of claim 2, wherein the semiconductor laser device is an optically pumped semiconductor laser device.

16. The laser system of claim 2, wherein the semiconductor laser device is an electrically pumped semiconductor laser device.

17. A method for producing a substantially mode-hop-free laser system, comprising:
providing one or more semiconductor laser devices; and
forming a folded cavity external to the one or more semiconductor laser devices including:
positioning at least one of the one or more semiconductor laser devices at a fold in the folded cavity;
positioning at least one mirror in the folded cavity to enable sustained propagation of light within the folded cavity; and
positioning at least two polarization elements in the folded external cavity, the at least two polarization elements configured to cause a polarization state of light that impinges in a first direction on each semiconductor laser device that is positioned at a corresponding fold to be orthogonal to a polarization state of light that impinges in a second direction on each semiconductor laser device that is positioned at the corresponding fold.

18. The method of claim 17, further comprising positioning a third polarization element between the second mirror and the second polarization element.

19. The method of claim 18, wherein the third polarization element is a birefringent filter.

20. The method of claim 18, wherein the third polarization element is configured to:
cause light that propagates from the third polarization element towards the second polarization element to be linearly polarized, or
enable wavelength tuning of laser light that is output from the laser system.

21. The method of claim 17, further comprising positioning a non-linear crystal within the external folded cavity configured to modify a frequency of output laser light by second harmonic generation.

22. The method of claim 18, wherein the semiconductor laser device includes a vertical external cavity surface emitting laser (VECSEL), an optical semiconductor laser (OPSL), or a semiconductor disk laser (SDL).

23. The method of claim 17, further comprising placing an output coupler at one end of the folded external cavity to allow laser light to be transmitted through the output coupler and to provide laser light that is output from the laser system.

24. A laser system, comprising:
a first semiconductor laser gain device;
a second semiconductor laser gain device; and
an external folded cavity including:
a first mirror positioned at one end of the external folded cavity,
an output coupler positioned at another end of the external folded cavity,
a second mirror positioned between the first semiconductor laser gain device and the second laser gain device,
a third mirror positioned between the second semiconductor laser gain device and the output coupler, and
a first polarization element and a second polarization element, wherein:
the first semiconductor laser gain device is positioned at a first cavity fold between the first mirror and the second mirror,
the second semiconductor laser gain device is positioned at a second cavity fold between the second mirror and the third mirror,
the first polarization element is positioned between the first mirror and the first semiconductor laser gain device,
the second polarization element is positioned between the third mirror and the second semiconductor laser gain device, and
the first and the second polarization elements are configured to cause light that propagates from the first polarization element towards each of the first and the second semiconductor laser gain devices to have an orthogonal polarization state compared to light that propagates from the second polarization element towards each of the first and the second semiconductor laser gain devices.

25. The laser system of claim 24, wherein each of the first and the second polarization elements is a quarter wave plate that converts a linearly polarized light into a circularly polarized light and vice versa.

26. The laser system of claim 24, wherein the first polarization element is configured to produce one of either a clockwise or a counterclockwise circularly polarized light that propagates from the first polarization element towards each of the first and the second semiconductor laser gain devices, and the second polarization element is configured to produce another of the clockwise or the counterclockwise circularly polarized light that propagates from the second polarization element towards each of the first and the second semiconductor laser gain devices.

27. The laser system of claim 24, wherein the first mirror is a flat mirror and at least one of the second or third mirrors is a curved mirror.

28. The laser system of claim 24, further comprising a third polarization element positioned between the third mirror and the second polarization element.

29. The laser system of claim 28, wherein the third polarization element is a birefringent filter.

30. The laser system of claim 28, wherein the third polarization element is configured to:
cause light that propagates from third polarization element towards the second polarization element to be linearly polarized, or
enable wavelength tuning of laser light that is transmitted through the output coupler.

31. The laser system of claim 24, further including a non-linear crystal positioned within the external folded cavity to cause doubling of output laser light frequency by second harmonic generation.

32. The laser system of claim 24, wherein the first or the second semiconductor laser gain devices include a vertical external cavity surface emitting laser (VECSEL), an optical semiconductor laser (OPSL), or a semiconductor disk laser (SDL).

33. The laser system of claim 24, configured to produce a single mode laser light that is transmitted through the output coupler.

34. The laser system of claim 24, configured to produce an output power of greater than 20 Watts.

35. The laser system of claim 24, configured to produce an output power that is a summation of an output power producible by the first semiconductor laser gain device and an output power producible by the second semiconductor laser gain device.

36. The laser system of claim 24, configured to produce a single frequency output light with a spectral linewidth that is less than 1 GHz.

37. The laser system of claim 36, wherein the spectral linewidth is about 10 MHz or less.

* * * * *